US012684276B2

(12) United States Patent
Chang et al.

(10) Patent No.: US 12,684,276 B2
(45) Date of Patent: Jul. 14, 2026

(54) ELECTRONIC DEVICE

(71) Applicant: Merry Electronics(Shenzhen) Co., Ltd., ShenZhen (CN)

(72) Inventors: Yung-Hsiang Chang, Taichung (TW); Yueh-Kang Lee, Taichung (TW); Jia Yin Wu, Taichung (TW)

(73) Assignee: Merry Electronics(Shenzhen) Co., Ltd., ShenZhen (CN)

( * ) Notice: Subject to any disclaimer, the term of this patent is extended or adjusted under 35 U.S.C. 154(b) by 383 days.

(21) Appl. No.: 18/418,365

(22) Filed: Jan. 22, 2024

(65) Prior Publication Data

US 2025/0212348 A1     Jun. 26, 2025

(30) Foreign Application Priority Data

Dec. 20, 2023    (TW) ................................. 112149747

(51) Int. Cl.
| | |
|---|---|
| *H04R 1/08* | (2006.01) |
| *B81B 3/00* | (2006.01) |
| *H04R 1/44* | (2006.01) |
| *H04R 19/04* | (2006.01) |

(52) U.S. Cl.
CPC .............. *H04R 1/086* (2013.01); *B81B 3/00* (2013.01); *B81B 2207/09* (2013.01); *B81B 2207/11* (2013.01); *H04R 1/44* (2013.01); *H04R 19/04* (2013.01); *H04R 2201/003* (2013.01)

(58) Field of Classification Search
CPC .... B81B 2203/0127; B81B 2203/0315; B81B 2207/012; B81B 2201/0257; H04R 1/086
See application file for complete search history.

(56) References Cited

U.S. PATENT DOCUMENTS

| | | | |
|---|---|---|---|
| 2022/0212920 A1* | 7/2022 | Sooriakumar ....... | H04R 1/2876 |
| 2024/0327202 A1* | 10/2024 | Li ........................ | H05K 7/1427 |

FOREIGN PATENT DOCUMENTS

KR            101454325       * 11/2014

* cited by examiner

*Primary Examiner* — Matthew L Reames
(74) *Attorney, Agent, or Firm* — JCIPRNET

(57) ABSTRACT

An electronic device includes a substrate, a sensor, an inner cover, a water proof member, and an outer cover. The sensor is disposed on the substrate. The inner cover is disposed on the substrate and covers the sensor. The inner cover includes an opening. The water proof member is disposed on the inner cover and covers the opening. The outer cover is disposed on the substrate and covers the inner cover, so that a drainage chamber is formed between the inner cover and the outer cover. The drainage chamber communicates with outside through a first hole and a second hole. The first hole and the second hole are staggered with the opening. A portion of the drainage chamber between the first hole and the second hole acts as a drainage channel. A length of the drainage channel is greater than a diameter of the opening.

15 Claims, 5 Drawing Sheets

ELECTRONIC DEVICE

CROSS-REFERENCE TO RELATED APPLICATION

This application claims the priority benefit of Taiwan application serial no. 112149747, filed on Dec. 20, 2023. The entirety of the above-mentioned patent application is hereby incorporated by reference herein and made a part of this specification.

BACKGROUND

Technical Field

The disclosure relates to an electronic device, and in particular to an electronic device with a drainage chamber.

Description of Related Art

The outer cover of common electronic devices (such as devices with microphones or sensors) usually have openings to communicate the air inside the chamber with outside. In addition, a water proof member may be disposed on the opening to prevent dust or water droplets from entering the chamber of the electronic device. However, when the electronic device is impacted by a strong water flow, the water proof member may not completely block the impact of the high-pressure water flow, so that part of the water flow may enter the chamber through the opening, thereby affecting the operation of the electronic device. How to prevent the water flow from entering the chamber is one of the research goals for researchers in this field.

SUMMARY

The disclosure provides an electronic device, and an outer cover thereof can reduce a probability of water flow from outside entering the interior of a chamber.

The electronic device of the disclosure includes a substrate, a sensor, an inner cover, a water proof member, and an outer cover. The sensor is disposed on the substrate. The inner cover is disposed on the substrate, covers the sensor, and includes an opening. The water proof member is disposed on the inner cover and covers the opening. The outer cover is disposed on the substrate and covers the inner cover, so that a drainage chamber is formed between the inner cover and the outer cover. The drainage chamber communicates with outside through a first hole and a second hole. The first hole and the second hole are staggered with the opening. A portion of the drainage chamber between the first hole and the second hole acts as a drainage channel. A length of the drainage channel is greater than a diameter of the opening.

In an embodiment of the disclosure, the opening, the first hole, and the second hole face the same direction.

In an embodiment of the disclosure, the first hole and the second hole face different directions.

In an embodiment of the disclosure, the substrate has a perforation. The perforation communicates the drainage chamber with the outside.

In an embodiment of the disclosure, the inner cover includes an inner cover top wall. The outer cover includes an outer cover top wall close to the inner cover top wall. A distance between the inner cover top wall and the outer cover top wall is between 0.1 to 1 mm.

In an embodiment of the disclosure, the opening is formed on an inner cover top wall of the inner cover. The outer cover includes an outer cover top wall close to the inner cover top wall. The first hole and the second hole are formed on the outer cover top wall.

In an embodiment of the disclosure, the opening is formed in an inner cover top wall of the inner cover. The first hole is formed on an outer cover top wall of the outer cover. The second hole is formed on an outer cover side wall of the outer cover.

In an embodiment of the disclosure, the opening is formed on an inner cover top wall of the inner cover. The first hole is formed on an outer cover top wall of the outer cover. The second hole is formed on the substrate.

In an embodiment of the disclosure, the substrate includes a top layer, a via located on the top layer, a bottom layer, and an internal chamber located between the top layer and the bottom layer.

In an embodiment of the disclosure, the substrate includes multiple inner supporting elements located in the internal chamber and connected to the top layer and the bottom layer.

In an embodiment of the disclosure, the sensor has a back chamber. The back chamber communicates with the internal chamber through the perforation.

In an embodiment of the disclosure, the substrate further includes multiple electrode layers located on another side of the substrate relative to the outer cover.

In an embodiment of the disclosure, each of the first hole and the second hole has a diameter greater than 50 microns.

In an embodiment of the disclosure, the water proof member is located in the drainage channel.

In an embodiment of the disclosure, the drainage channel has at least one inflection.

Based on the above, the outer cover of the electronic device of the disclosure covers the inner cover. The outer cover has a first hole and a second hole. The first hole and the second hole are staggered with the opening of the inner cover. In this way, when higher-pressure water flow washes the outer cover, the water proof member is not directly impacted by the high-pressure water flow, thereby reducing the probability of the high-pressure water flow entering the interior of the chamber through the opening.

DESCRIPTION OF THE EMBODIMENTS

Figure 1:
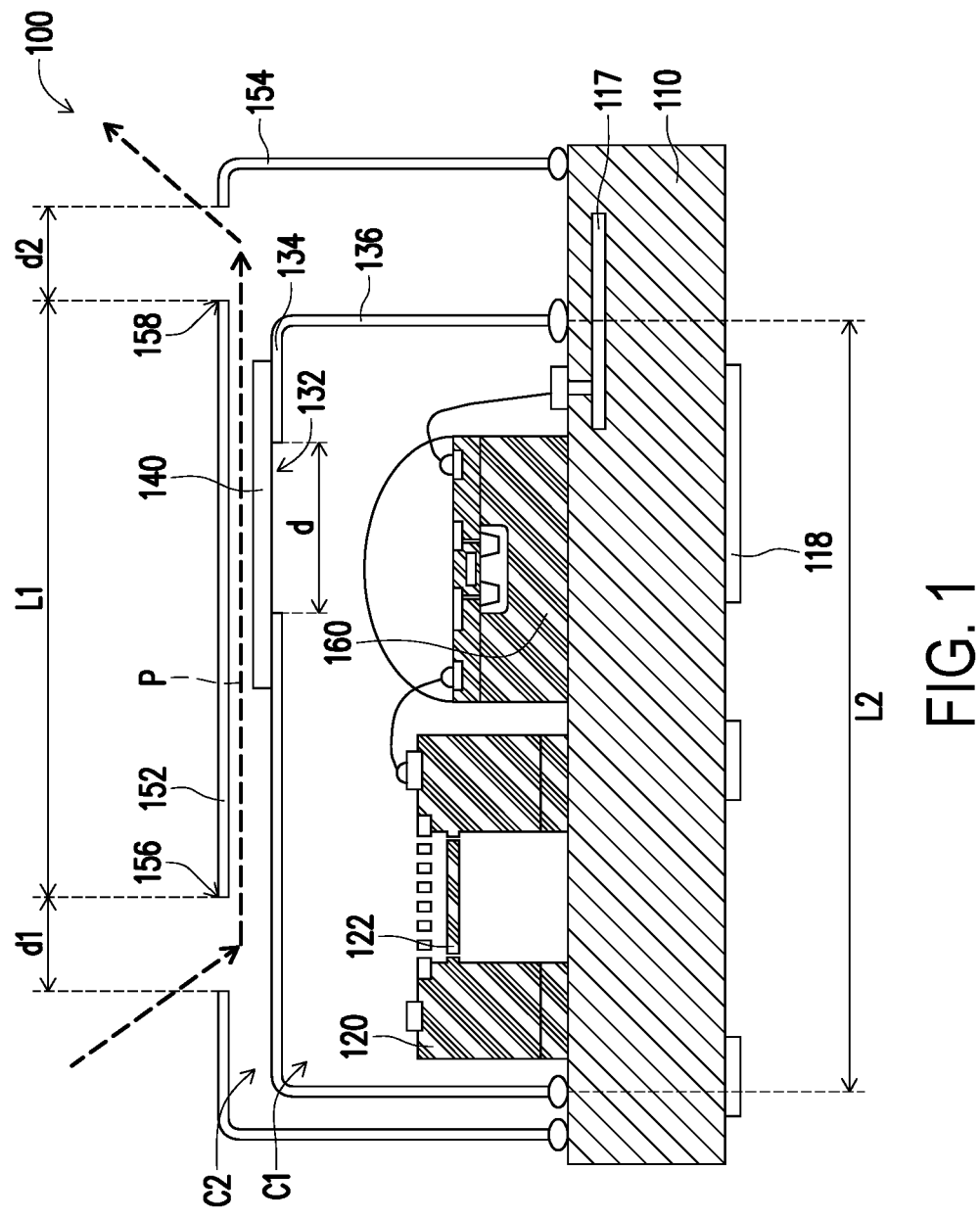
FIG. 1 is a schematic cross-sectional view of an electronic device according to the first embodiment of the disclosure.

FIG. 1 is a schematic cross-sectional view of an electronic device according to the first embodiment of the disclosure. Referring to FIG. 1, an electronic device 100 in this embodiment is, for example, a microphone or a pressure sensor device, but the disclosure does not limit the type of the electronic device 100.

The electronic device 100 of this embodiment includes a substrate 110, a sensor 120, an inner cover 130, and a water proof member 140. The sensor 120 is disposed on the substrate 110. The inner cover 130 is disposed on the substrate 110 and covers the sensor 120. The inner cover 130 includes an opening 132. The opening 132 is disposed on an inner cover top wall 134 of the inner cover 130. The water proof member 140 is disposed on the inner cover top wall 134 of the inner cover 130 and covers the opening 132.

Specifically, the sensor 120 is located in a chamber C1 formed between the substrate 110 and the inner cover 130, and the opening 132 communicates with the chamber C1. The water proof member 140 may prevent external water flow or dust from entering the chamber C1 to protect internal components of the chamber C1 from being damaged due to moisture.

In this embodiment, the sensor 120 includes, for example, a MEMS chip. The MEMS chip may be applied in microphones, bone conduction vibration sensors, barometers, etc., but the type of the sensor 120 is not limited thereto. The sensor 120 includes a film 122. The sensor 120 may convert a deformation generated by the film 122 into an electrical signal.

In addition, a control chip 160 is disposed on the substrate 110 and located in the chamber C1. The control chip 160 is electrically connected to the sensor 120 and the substrate 110. In detail, the sensor 120 is connected to the control chip 160 through wire bonding, for example. The control chip 160 is connected to an internal circuit layer 117 of the substrate 110 through wire bonding, for example. The control chip 160 is, for example, an ASIC chip, but the disclosure is not limited thereto.

The electronic device 100 of this embodiment includes an outer cover 150 disposed on the substrate 110 and covering the inner cover 130, so that a drainage chamber C2 is formed between the inner cover 130 and the outer cover 150. The drainage chamber C2 communicates with outside through a first hole 156 and a second hole 158. In addition, a portion of the drainage chamber C2 between the first hole 156 and the second hole 158 acts as a drainage channel P. The water proof member 140 is located in the drainage channel P.

Specifically, the outer cover 150 includes an outer cover top wall 152 close to the inner cover top wall 134. The first hole 156 and the second hole 158 in this embodiment are formed on the outer cover top wall 152. In other embodiments, the first hole 156 and the second hole 158 may also be formed on an outer cover side wall 154. The disclosure does not limit the first hole 156 and the second hole 158 to be disposed on the outer cover top wall 152 or the outer cover side wall 154.

As shown in FIG. 1, when water flow washes against the outer cover 150, the first hole 156 acts as an inlet hole, and the second hole 158 acts as a drainage hole, for example. The water flow is adapted to enter from the inlet hole (such as the first hole 156) and flow along the drainage channel P, and then the water flow is discharged from the drainage hole (such as the second hole 158) to the outside. Of course, the first hole 156 and the second hole 158 may also be the drainage hole and the inlet hole respectively to discharge the water flow entering the drainage channel P.

In this embodiment, the first hole 156 and the second hole 158 are staggered with the opening 132 of the inner cover 130. Specifically, when a relatively high-pressure water flow washes against the outer cover 150, since the first hole 156 and the second hole 158 are staggered with the opening 132, the water proof member 140 is not directly impacted by the external high-pressure water flow, thereby reducing a probability of the external high-pressure water flow passing through the opening 132 and entering the inside of the chamber C1.

In addition, the outer cover 150 of this embodiment has a double-hole design of the inlet hole and the drainage hole (i.e., the first hole 156 and the second hole 158), which may release a dynamic water pressure of the water flow and also allow the air in the drainage chamber C2 to maintain a pressure balance so that the water flow may be smoothly discharged from the drainage hole to the outside.

The outer cover 150 of this embodiment defines a flow path of the drainage channel P between a vertical projection of the first hole 156 to the drainage chamber C2 and a vertical projection of the second hole 158 to the drainage chamber C2. A length L1 of the flow path of the drainage channel P is greater than a diameter d of the opening 132. The length L1 of the drainage channel P is greater than or equal to more than half of a length L2 of the inner cover 130. The length L1 of the drainage channel P is greater than 0.2 times of the length L2 of the inner cover 130. In addition, there is a distance between the inner cover top wall 134 and the outer cover top wall 152 of this embodiment ranging from 0.1 to 1 mm. Through the above design, a certain flow path may be ensured. When the high-pressure water flow enters the drainage chamber C2, the dynamic water pressure is released to a certain extent to avoid damage to the water proof member 140 caused by excessive water pressure in the drainage chamber C2.

The substrate 110 of this embodiment further includes multiple electrode layers 118 located on another side of the substrate 110 relative to the outer cover 150. The electronic device 100 of this embodiment may be electrically connected to and disposed on other devices (such as a vehicle body) through the electrode layer 118. In addition, the electronic device 100 is adapted to be disposed on other devices through the electrode layer 118 in a flip-chip manner (i.e., an upside-down state in FIG. 1). At this time, the first hole 156 and the second hole 158 are located at the lower position of the entire electronic device 100. Such an arrangement may cause the water flow in the drainage chamber C2 to move downward due to gravity, so that the water flow may be quickly discharged to the outside from the first hole 156 or the second hole 158 below.

It is worth mentioning that the opening 132, the first hole 156, and the second hole 158 of this embodiment face the same direction (for example, the up and down direction in FIG. 1). Such a design may help external sound enter the chamber C1 smoothly from the first hole 156, the second hole 158, and the opening 132. In other embodiments, the opening 132, the first hole 156 and, the second hole 158 may also face different directions, and the disclosure is not limited thereto.

In addition, diameters d1 and d2 of each of the first hole 156 and the second hole 158 are greater than 50 microns to ensure the acoustic characteristics of the sound are not affected when the sound enters the chamber C1 from the first hole 156, the second hole 158, and the opening 132. Specifically, the diameters d1 and d2 of each of the first hole 156 and the second hole 158 are greater than 50 microns, which may effectively prevent the electronic device 100 from generating a resonance frequency in an audible frequency range (between 20 Hz and 20 kHz), and may prevent the electronic device 100 from producing sharp sounds, thereby avoiding affecting an experience of an user.

It should be added that the disclosure does not limit the number of holes disposed on the outer cover 150 as long as the number of holes disposed on the outer cover 150 is ensured to be greater than two, so that the water flow may smoothly enter and exit the drainage chamber C2, and all holes are staggered with the opening 132. However, when the number of holes disposed on the outer cover 150 increases, more dust enters the drainage chamber C2. Therefore, the number of holes on the outer cover 150 is not suitable for being too many. In addition, materials of the inner cover 130 and the outer cover 150 of this embodiment are both metal materials, thereby further preventing external electromagnetic interference.

In addition, in other embodiments, the opening 132 and the water proof member 140 may also be disposed on an inner cover side wall 136 of the inner cover 130 so that the water proof member 140 is not located on the drainage channel P. The disclosure is not limited thereto.

Figure 2:
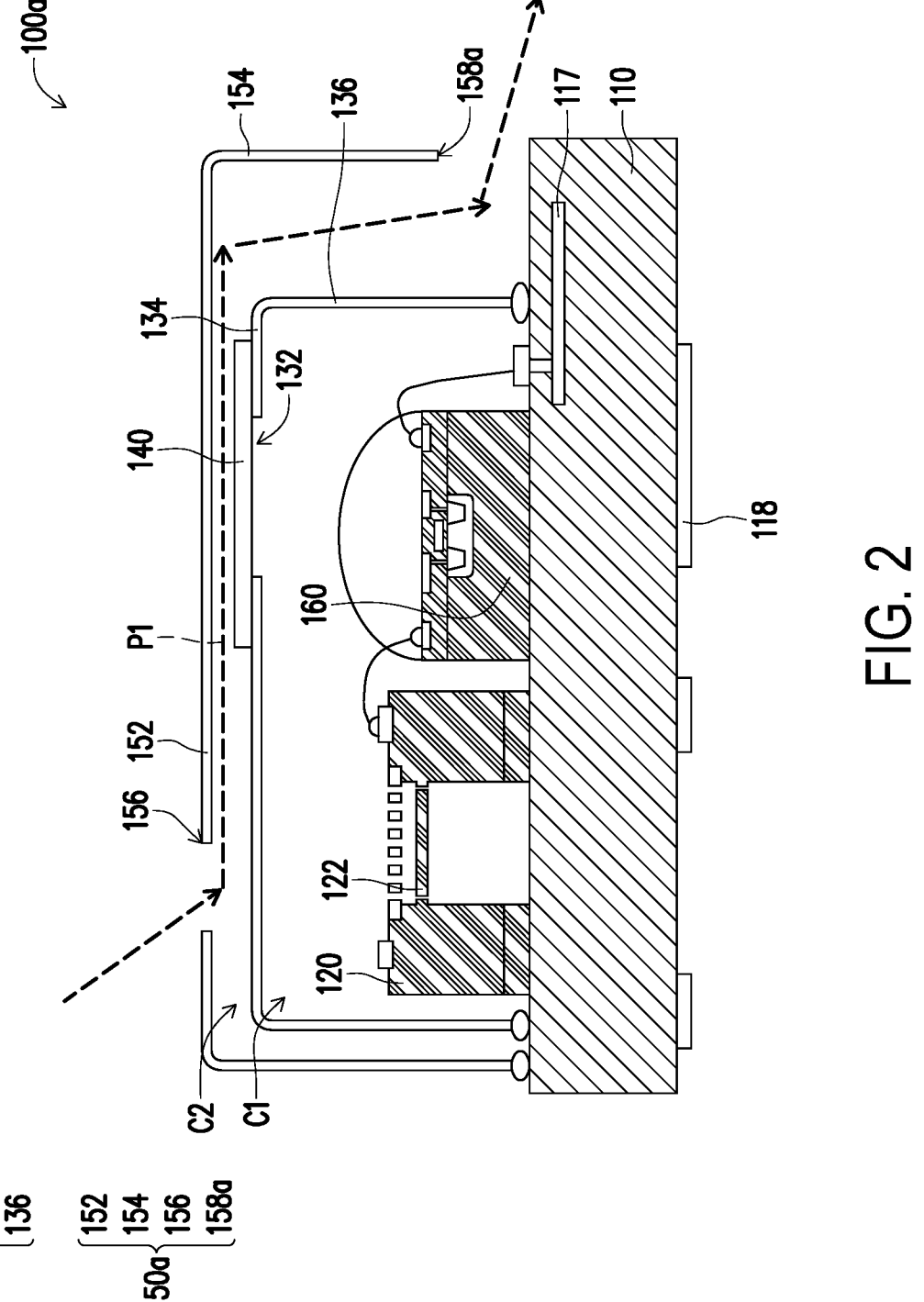
FIG. 2 is a schematic cross-sectional view of an electronic device according to the second embodiment of the disclosure.

FIG. 2 is a schematic cross-sectional view of an electronic device according to the second embodiment of the disclosure. Referring to FIG. 2, the main difference between an electronic device 100a of this embodiment and the electronic device 100 of FIG. 1 is that in this embodiment, the first hole 156 and a second hole 158a face different directions.

Specifically, the opening 132 of this embodiment is formed on the inner cover top wall 134 of the inner cover 130. The first hole 156 is formed on the outer cover top wall 152 of an outer cover 150a. The second hole 158a is formed on the outer cover side wall 154 of the outer cover 150a. Since the first hole 156 and the second hole 158a are respectively located on the outer cover top wall 152 and the outer cover side wall 154 and face different directions, the drainage channel P1 has a inflection, which may further release the dynamic water pressure of the high-pressure water flow entering the drainage chamber C2 to prevent the water proof member 140 from being damaged due to the excessive water pressure in the drainage chamber C2, thereby reducing the probability of water flow passing through the water proof member 140 and entering the interior of the chamber C1.

In addition, the electronic device of this embodiment is adapted to be disposed on other devices in a formal manner (i.e., the state of FIG. 2). At this time, the first hole 156 is located at a high position of the entire electronic device 100a, and the second hole 158a is located at a low position of the entire electronic device 100a. In such an arrangement, when the water flow enters the drainage chamber C2 from the upper first hole 156, the water flow is moved downward along the drainage channel P1 due to gravity, so that the water flow is discharged quickly from the lower second hole 158a to the outside.

Figure 3:
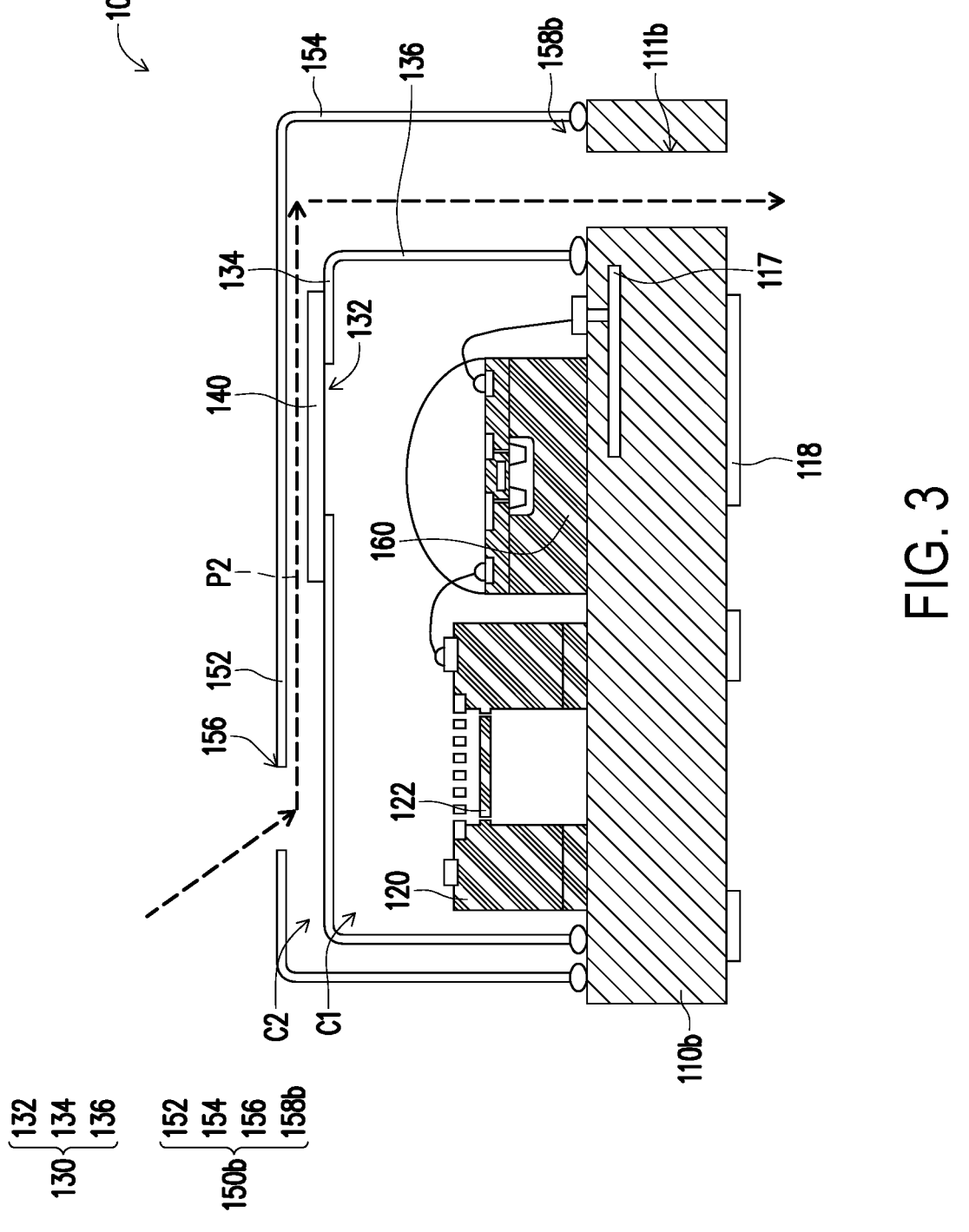
FIG. 3 is a schematic cross-sectional view of an electronic device according to the third embodiment of the disclosure.

FIG. 3 is a schematic cross-sectional view of an electronic device according to the third embodiment of the disclosure. Referring to FIG. 3, the main difference between an electronic device 100b of this embodiment and the electronic device 100a of FIG. 2 is that in this embodiment, a substrate 110b has a perforation 111b, and the perforation 111b communicates the drainage chamber C2 with the outside.

Specifically, the opening 132 of this embodiment is formed on the inner cover top wall 134 of the inner cover 130. The first hole 156 is formed on the outer cover top wall 152 of an outer cover 150b. A second hole 158b is formed on the substrate 110b. The second hole 158b is connected to the perforation 111b.

The electronic device 100b of this embodiment is adapted to be disposed on other devices in the formal manner (i.e., the state in FIG. 3). At this time, the first hole 156 is located at the high position of the entire electronic device 100b, and the second hole 158b is located at the low position of the entire electronic device 100b. In such an arrangement, when the water flow enters the drainage chamber C2 from the upper first hole 156, the water flow is moved downward along the drainage channel P2 due to gravity, so that the water flow is discharged quickly from the lower second hole 158b and the perforation 111b to the outside.

Figure 4:
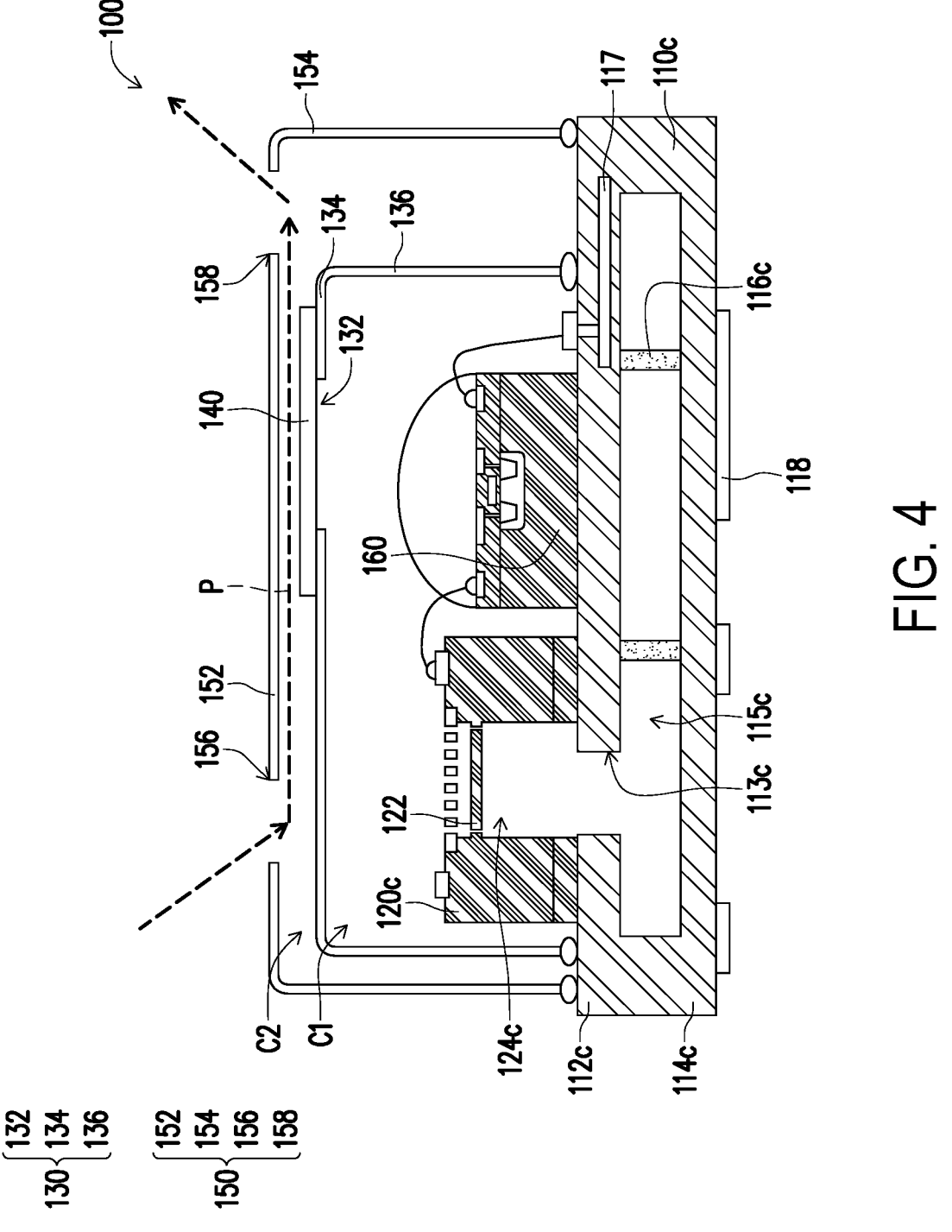
FIG. 4 is a schematic cross-sectional view of an electronic device according to the fourth embodiment of the disclosure.

FIG. 4 is a schematic cross-sectional view of an electronic device according to the fourth embodiment of the disclosure. Referring to FIG. 4, the main difference between an electronic device 100c of this embodiment and the electronic device 100 of FIG. 1 is that in this embodiment, a substrate 110c has an internal chamber 115c.

Specifically, the substrate 110c includes a top layer 112c, a via 113c located on the top layer 112c, a bottom layer 114c, and the internal chamber 115c located between the top layer 112c and the bottom layer 114c. The top layer 112c carries a sensor 120c, the inner cover 130, and a control chip 160. An internal circuit layer 117 is disposed on the top layer 112c. The electrode layer 118 is disposed on the bottom layer 114c and is disposed relative to another side of the internal chamber 115c.

The sensor 120c has a back chamber 124c. The back chamber 124c communicates with the internal chamber 115c through the via 113c. By disposing the internal chamber 115c on the substrate 110c and having the back chamber 124c communicating with the internal chamber 115c, the internal chamber 115c acts as a part of the back chamber 124c of the sensor 120c, so that the sensor 120c has a greater back chamber space (i.e., the back chamber 124c and the internal chamber 115c in FIG. 4). Thereby, a back chamber volume of the sensor 120c is increased, effectively improving a performance of an acoustic signal-to-noise ratio.

The substrate 110c of this embodiment includes multiple inner supporting elements 116c (two are shown) located on the internal chamber 115c and connected to the top layer 112c and the bottom layer 114c. The inner supporting element 116c can enhance an overall rigidity of the substrate 110c.

In addition, similar to the electronic device 100 of FIG. 1, the first hole 156 and the second hole 158 of this embodiment are staggered with the opening 132. The water flow from the outside may enter and exit the drainage chamber C2 through the first hole 156 and the second hole 158, and the water proof member 140 is not directly impacted by the external high-pressure water flow, thereby reducing the probability of the water flow entering the interior of the chamber C1 through the opening 132.

Figure 5:
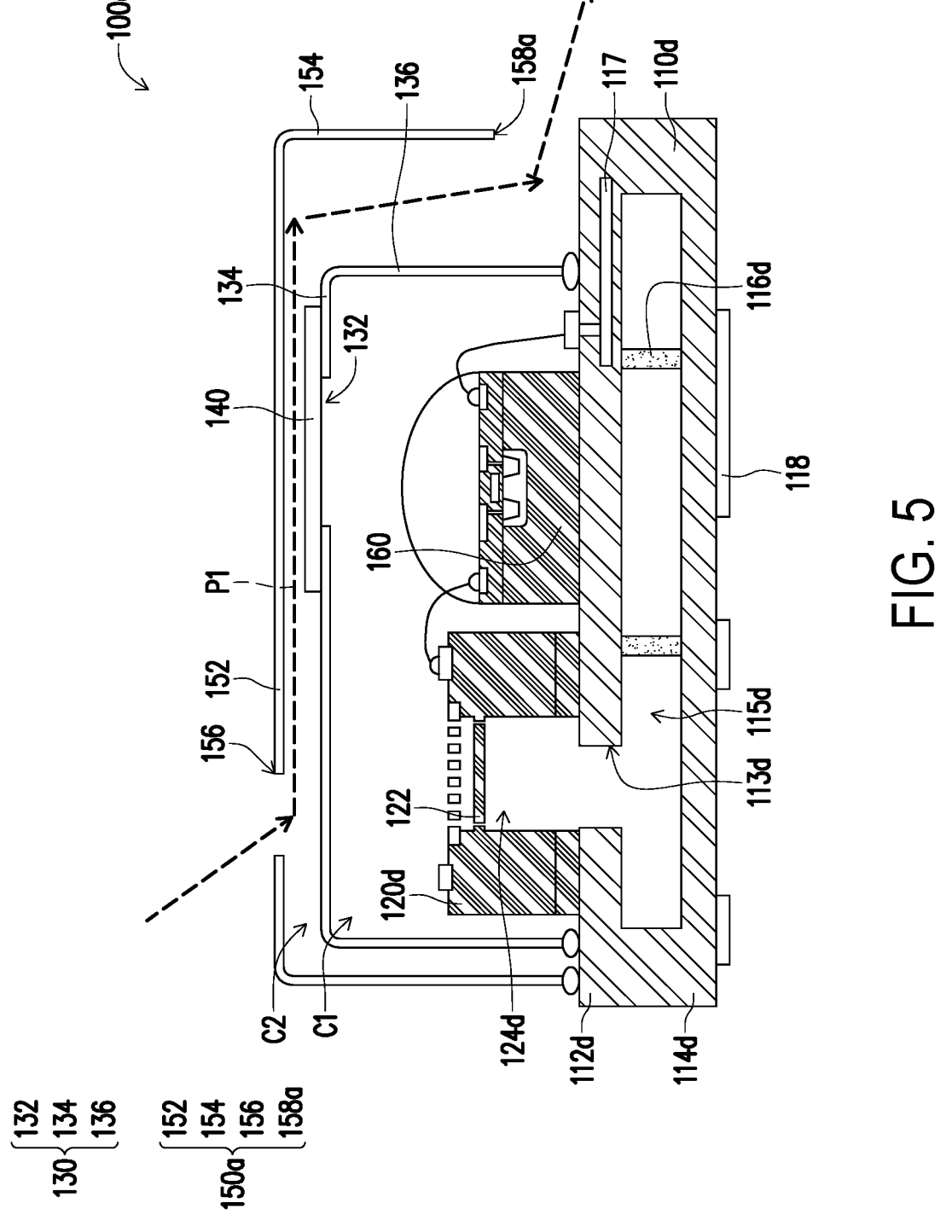
FIG. 5 is a schematic cross-sectional view of an electronic device according to the fifth embodiment of the disclosure.

FIG. 5 is a schematic cross-sectional view of an electronic device according to the fifth embodiment of the disclosure. Referring to FIG. 5, the main difference between an electronic device 100d of this embodiment and the electronic device 100a of FIG. 2 is that in this embodiment, a substrate 110d has an internal chamber 115d communicating with the chamber C1.

Specifically, the structural configuration of a top layer 112d, a via 113d, a bottom layer 114d, the internal chamber 115d, and multiple inner supporting elements 116d of the substrate 110d, and a back chamber 124d of a sensor 120d of this embodiment is the same as the structural configuration of the top layer 112c, the via 113c, the bottom layer 114c, the internal chamber 115c, and the inner supporting elements 116c of the substrate 110c and the back chamber 124c of the sensor 120c of FIG. 4. In other words, the sensor 120d of this embodiment can also effectively improve the performance of the acoustic signal-to-noise ratio. In addition, the inner supporting element 116d can also enhance the overall rigidity of the substrate 110d.

In addition, similar to the electronic device 100*a* in FIG. 2, the first hole 156 and the second hole 158*a* in this embodiment are staggered with the opening 132. The water flow from the outside may enter and exit the drainage chamber C2 through the first hole 156 and the second hole 158*a*, and the water proof member 140 is not directly impacted by the external high-pressure water flow, thereby reducing the probability of the water flow entering the interior of the chamber C1 through the opening 132.

To sum up, the outer cover of the electronic device of the disclosure covers the opening of the inner cover. The outer cover has a first hole and a second hole. The first hole and the second hole are staggered with the opening. In this way, when the higher-pressure water flow washes against the outer cover, the water proof member is not directly impacted by the external high-pressure water flow, thereby reducing the probability of the high-pressure water flow entering the interior of the chamber through the opening.

In addition, through the deposition of the internal chamber formed by the top layer and the bottom layer communicating with the back chamber of the sensor of the electronic device of the disclosure, the internal chamber acts as a part of a chamber body of the sensor, so that the sensor has the greater chamber body. In this way, the sensor can effectively improve the performance of the acoustic signal-to-noise ratio.

What is claimed is:

1. An electronic device, comprising:
a substrate;
a sensor, disposed on the substrate;
an inner cover, disposed on the substrate, covering the sensor, and comprising an opening;
a water proof member, disposed on the inner cover and covering the opening; and
an outer cover, disposed on the substrate and covering the inner cover such that a drainage chamber is formed between the inner cover and the outer cover, wherein the drainage chamber communicates with outside through a first hole and a second hole, the first hole and the second hole are staggered with the opening, portion of the drainage chamber between the first hole and the second hole acts as a drainage channel, a length of the drainage channel is greater than a diameter of the opening.

2. The electronic device according to claim 1, wherein the opening, the first hole, and the second hole face the same direction.

3. The electronic device according to claim 1, wherein the first hole and the second hole face different directions.

4. The electronic device according to claim 3, wherein the substrate has a perforation, and the perforation communicates the drainage chamber with the outside.

5. The electronic device according to claim 1, wherein the inner cover comprises an inner cover top wall, the outer cover comprises an outer cover top wall close to the inner cover top wall, and a distance between the inner cover top wall and the outer cover top wall is between 0.1 to 1 mm.

6. The electronic device of claim 1, wherein the opening is formed on an inner cover top wall of the inner cover, the outer cover comprises an outer cover top wall close to the inner cover top wall, and the first hole and the second hole are formed on the outer cover top wall.

7. The electronic device according to claim 1, wherein the opening is formed on an inner cover top wall of the inner cover, the first hole is formed on an outer cover top wall of the outer cover, and the second hole is formed on an outer cover side wall of the outer cover.

8. The electronic device according to claim 1, wherein the opening is formed on an inner cover top wall of the inner cover, the first hole is formed in an outer cover top wall of the outer cover, and the second hole is formed on the substrate.

9. The electronic device according to claim 1, wherein the substrate comprises a top layer, a via located on the top layer, a bottom layer, and an internal chamber located between the top layer and the bottom layer.

10. The electronic device according to claim 9, wherein the substrate comprises a plurality of inner supporting elements located in the internal chamber and connected to the top layer and the bottom layer.

11. The electronic device according to claim 9, wherein the sensor has a back chamber, and the back chamber communicates with the internal chamber through the via.

12. The electronic device according to claim 1, wherein the substrate further comprises a plurality of electrode layers located on another side of the substrate relative to the outer cover.

13. The electronic device according to claim 1, wherein the diameter of each of the first hole and the second hole is greater than 50 microns.

14. The electronic device according to claim 1, wherein the water proof member is located in the drainage channel.

15. The electronic device according to claim 1, wherein the drainage channel has at least one inflection.

* * * * *